(12) United States Patent
Kawata (10) Patent No.: US 10,111,318 B2
(45) Date of Patent: Oct. 23, 2018

(54) CIRCUIT SUBSTRATE, AND NOISE REDUCTION METHOD FOR CIRCUIT SUBSTRATE

(71) Applicant: Yamaha Corporation, Hamamatsu-shi, Shizuoka (JP)

(72) Inventor: Akihiro Kawata, Tokyo (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 15/317,437

(22) PCT Filed: Jun. 12, 2015

(86) PCT No.: PCT/JP2015/067090
§ 371 (c)(1),
(2) Date: Dec. 9, 2016

(87) PCT Pub. No.: WO2015/190610
PCT Pub. Date: Dec. 17, 2015

(65) Prior Publication Data
US 2017/0127510 A1 May 4, 2017

(30) Foreign Application Priority Data
Jun. 12, 2014 (JP) .................. 2014-121596

(51) Int. Cl.
*H04B 3/28* (2006.01)
*H05K 1/02* (2006.01)

(52) U.S. Cl.
CPC ........... *H05K 1/0236* (2013.01); *H05K 1/025* (2013.01)

(58) Field of Classification Search
CPC ........ H05K 1/0236; H05K 1/025; H05K 1/16; H05K 1/0298
See application file for complete search history.

(56) References Cited

U.S. PATENT DOCUMENTS 9,755,320 B2 * 9/2017 Tseng .................... H01P 1/2005
2005/0029632 A1 2/2005 McKinzie, III et al.
(Continued)

FOREIGN PATENT DOCUMENTS

JP 2008-4853 A 1/2008
JP 2010-10183 A 1/2010
(Continued)

OTHER PUBLICATIONS

Kim et al., "Compact Artificial Magnetic Conductor Designs Using Planar Square Spiral Geometries", Progress in Electromagnetics Research, PIER 77, 2007, pp. 43-54.
(Continued)

*Primary Examiner* — Robert J Pascal
*Assistant Examiner* — Kimberly Glenn
(74) *Attorney, Agent, or Firm* — Crowell & Moring LLP (57) ABSTRACT

A circuit substrate includes a core substrate, a reinforcing dielectric layer that is provided on one surface of the core substrate, a first electromagnetic band gap structure that is provided on one surface side of the reinforcing dielectric layer and reduces electromagnetic noise in a predetermined first frequency propagating through the core substrate, and an auxiliary pattern that is formed at a predetermined distance from an outer circumference of a pattern which forms the first electromagnetic band gap structure.

14 Claims, 8 Drawing Sheets (56) References Cited

U.S. PATENT DOCUMENTS

| | | | |
|---|---|---|---|
| 2006/0044210 A1 | 3/2006 | Ramprasad et al. | |
| 2007/0285336 A1 | 12/2007 | Kamgaing | |
| 2009/0315648 A1 | 12/2009 | Toyao | |
| 2010/0265011 A1 | 10/2010 | Ding et al. | |
| 2014/0300428 A1 | 10/2014 | Toyao | |
| 2014/0300429 A1 | 10/2014 | Toyao | |
| 2018/0026322 A1* | 1/2018 | Kasahara | H01P 1/2005 |

FOREIGN PATENT DOCUMENTS

| | | |
|---|---|---|
| JP | 2010-252329 A | 11/2010 |
| JP | 2013-153041 A | 8/2013 |

OTHER PUBLICATIONS

International Search Report (PCT/ISA/210) issued in PCT Application No. PCT/JP2015/067090 dated Sep. 1, 2015 with English translation (three pages).
Japanese-language Written Opinion (PCT/ISA/237) ) issued in PCT Application No. PCT/JP2015/067090 dated Sep. 1, 2015 (three pages).
Sievenpiper et al., "High-Impedance Electromagnetic Surfaces with a Forbidden Frequency Band", IEEE Transactions on Microwave Theory and Techniques, Nov. 1999, pp. 2059-2074, vol. 47, No. 11.

* cited by examiner

CIRCUIT SUBSTRATE, AND NOISE REDUCTION METHOD FOR CIRCUIT SUBSTRATE

TECHNICAL FIELD

The present invention relates to a circuit substrate in which electronic components are mounted and a noise reduction method for the circuit substrate.

BACKGROUND ART

According to demand for miniaturization of electronic components, a large quantity of integrated circuit chips or circuit components are required to be mounted on an electronic circuit substrate on which a semiconductor integrated circuit or the circuit components are mounted. Accordingly, demand for effective use of a wiring space or a mounting space is increasing.

Particularly, a signal which is used for information processing of an electronic circuit is a digital signal in a wireless local area network (LAN) communication, and thus an analog circuit which performs wireless communication and a digital circuit which performs information processing of a signal for communication are used together.

Accordingly, there is a problem in which electromagnetic noise that is generated by an operation clock of a central processing unit (CPU), a memory, or the like in the digital circuit, interferes with the analog circuit, and thus the signal for communication is degraded.

Accordingly, a technology is known which configures an electromagnetic band gap (EBG) structure by using an open stub that is formed in a spiral shape in an electronic circuit substrate, and thereby electromagnetic noise propagating through the electronic circuit substrate is reduced (refer to, for example, Non Patent Literature 1). That is, the electromagnetic band gap structure absorbs electrical energy of the electromagnetic noise which is generated from the digital circuit, and thereby the amount of electromagnetic noise which propagates through the electronic circuit substrate is reduced and the electromagnetic noise is prevented from interfering with the analog circuit.

CITATION LIST

Non Patent Literature

Non Patent Literature 1: Y. Kim, F. Yang, and A. Elsherbeni, Compact artificial magnetic conductor designs using planar square spiral geometry, Progress In Electromagnetics Research, PIER 77, pp. 43-54, 2007

SUMMARY OF INVENTION

Technical Problem

However, as described above, an electromagnetic band gap structure is formed by using an open stub with a spiral shape, and thus it is necessary to cope with a frequency of electromagnetic noise to be reduced by adjusting a length of the open stub. Accordingly, the more the frequency of the electromagnetic noise to be reduced is put in a lower frequency side, the more the length of the open stub needs to be increased. That is, the more the length of the open stub increases, the more a disposition area of the electromagnetic band gap structure increases, and thereby effective use of a mounting space is hampered.

The present invention is made in view of the situation, and provides a circuit substrate which prevents a disposition area of an electromagnetic band gap structure that is formed from an open stub with a spiral shape from increasing and can more effectively use a mounting space, even in a case where a frequency of electromagnetic noise to be reduced as a target is put in a lower frequency side, and a noise reduction method for the circuit substrate.

Solution to Problem

In order to solve the problem as mentioned above, a circuit substrate according to an aspect of the present invention includes: a core substrate; a reinforcing dielectric layer that is provided on one surface of the core substrate; a first electromagnetic band gap structure that is provided on one surface side of the reinforcing dielectric layer and configured to reduce electromagnetic noise in a predetermined first frequency propagating through the core substrate; and an auxiliary pattern that is formed at a predetermined distance from an outer circumference of a conductive pattern which forms the first electromagnetic band gap structure.

The circuit substrate according to an aspect of the present invention may be configured such that the auxiliary pattern has a length with capacitive impedance in a wavelength of the first frequency.

The circuit substrate according to an aspect of the present invention may be configured such that the auxiliary pattern is capacitively coupled with the first electromagnetic band gap structure.

The circuit substrate according to an aspect of the present invention may be configured such that the first electromagnetic band gap structure is configured with an open stub that is a pattern which is wired in a bent shape, and may further include a second electromagnetic band gap structure that is provided to be surrounded by the open stub and configured to reduce electromagnetic noise in a second frequency higher than the first frequency.

The circuit substrate according to an aspect of the present invention may be configured such that each of the first electromagnetic band gap structure and the auxiliary pattern is provided on a surface of the reinforcing dielectric layer, which faces the core substrate.

The circuit substrate according to an aspect of the present invention may be configured such that each of the first electromagnetic band gap structure and the auxiliary pattern is provided on a surface of the reinforcing dielectric layer, which does not face the core substrate.

The circuit substrate according to an aspect of the present invention may be configured such that the auxiliary pattern is formed by a closed ring structure or an open ring structure which is provided in a periphery of an outermost circumference of the first electromagnetic band gap structure.

A noise reduction method for a circuit substrate according to an aspect of the present invention is a noise reduction method for a circuit substrate including a core substrate and a reinforcing dielectric layer which is provided on one surface of the core substrate, the noise reduction method including: providing a first electromagnetic band gap structure on one surface side of the reinforcing dielectric layer so as to reduce electromagnetic noise in a predetermined first frequency propagating through the core substrate; providing an auxiliary pattern at a predetermined distance from an outer circumference of a conductive pattern in which the first electromagnetic band gap structure is formed; and causing the first electromagnetic band gap structure to reduce electromagnetic noise propagating through the circuit substrate.

Advantageous Effects of Invention

As described above, the present invention performs capacitance loading to a first electromagnetic band gap structure by using an auxiliary pattern, and decreases a resonance frequency of the first electromagnetic band gap structure. Accordingly, according to the present invention, the first electromagnetic band gap structure can be minimized and the mounting space can be effectively used, compared to a case where the resonance frequency is decreased by increasing a length of an outer circumference of the first electromagnetic band gap structure in the same manner as in the related art.

DESCRIPTION OF EMBODIMENTS

Hereinafter, an embodiment of the present invention will be described with reference to the drawings.

Figure 1:
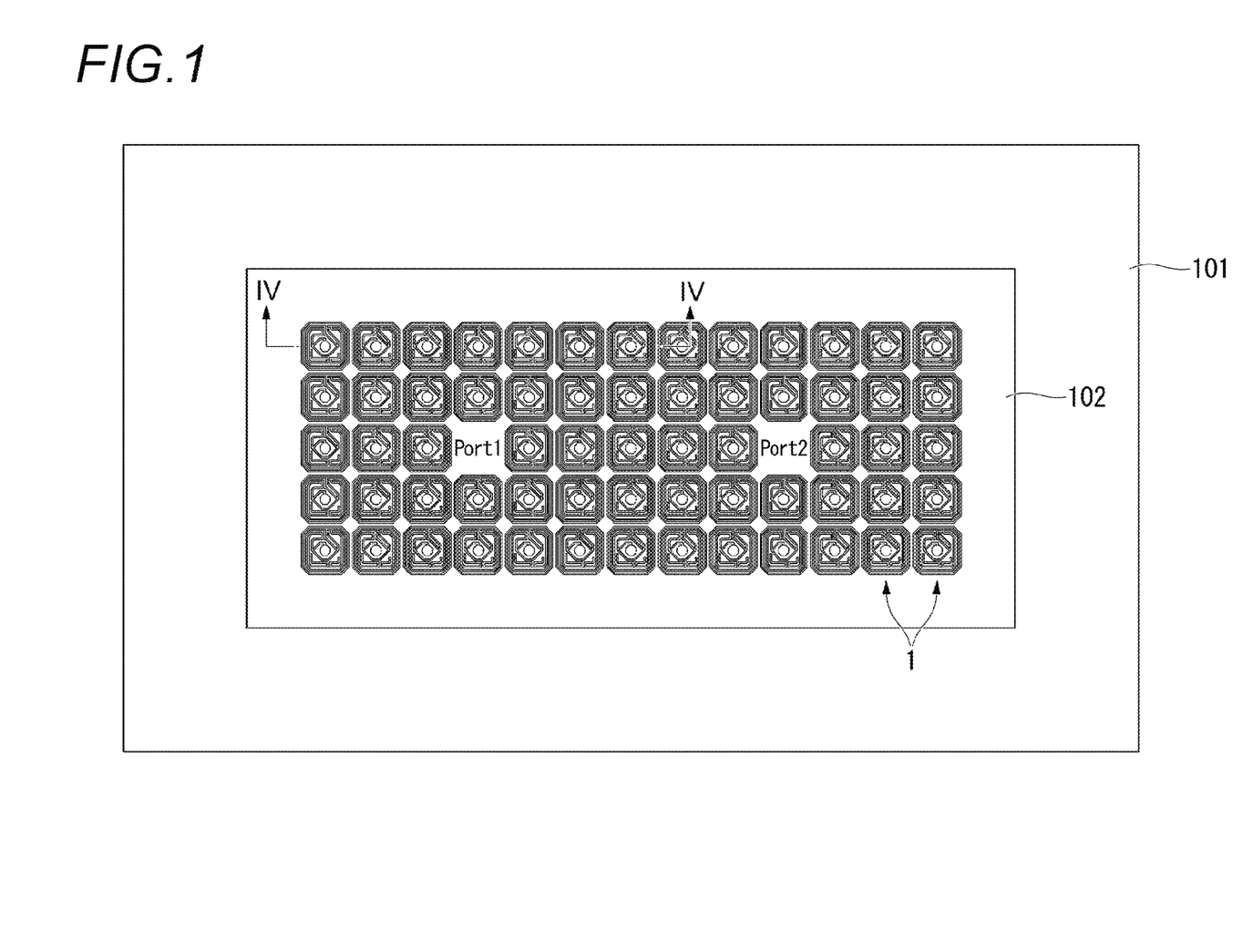
FIG. 1 is a plan view illustrating an example of a printed circuit substrate according to an embodiment of the present invention.

FIG. 1 is a plan view illustrating an example of a printed circuit substrate according to an embodiment of the present invention. FIG. 1 is a view in which a configuration of FIG. 9 that is a conceptual diagram of a basic configuration of an artificial magnetic conductor according to the present invention which will be described below is more specified in correspondence with the embodiment which will be described below. A power plane 102 is provided in an overlapping manner on an upper portion of one main surface (front surface) of a reference plane (for example, ground plane) 101. The power plane 102 is provided such that the other main surface (rear surface) thereof faces an upper surface (front surface) of the reference plane 101. The power plane 102 is provided such that the electromagnetic band gap structural bodies 1 are arranged in a predetermined cycle and in a matrix on one main surface (front surface) thereof.

The electromagnetic band gap structural body 1 absorbs electrical energy of electromagnetic noise which is generated from an electronic circuit (a central processing unit (CPU), a memory, and the like) disposed on a printed circuit substrate that is configured with the reference plane 101 and the power plane 102. In addition, the printed circuit substrate may be configured by a single body without being configured with a plurality of the electromagnetic band gap structural bodies 1 which are arranged in a matrix as described above. That is, in order to reduce electromagnetic noise which propagates through the printed circuit substrate, the electromagnetic band gap structural body 1 may be disposed only at a location facing an electronic circuit in which the electromagnetic noise is generated, and may be disposed on, for example, a per unit basis.

Figure 2:
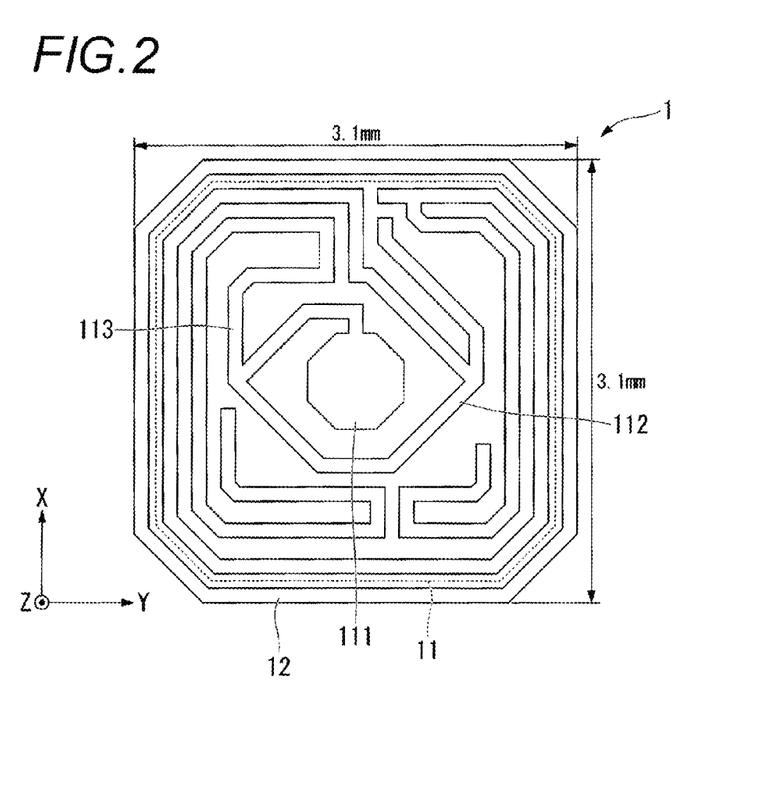
FIG. 2 is a plan view illustrating a configuration example of an electromagnetic band gap structural body 1 of FIG. 1.

FIG. 2 is a plan view illustrating a configuration example of the electromagnetic band gap structural body 1 of FIG. 1. In FIG. 2, the electromagnetic band gap structural body 1 has an electromagnetic band gap structure of a surface type which is formed on an upper portion of one main (front surface) of the power plane 102. In addition, for example, an outer shape of the electromagnetic band gap structural body 1 has a length of 3.1 mm in an X-axis direction and a length of 3.1 mm in a Y-axis direction.

The electromagnetic band gap structural body 1 is configured with an electromagnetic band gap structure 11 and an auxiliary pattern 12. The auxiliary pattern 12 has, for example, a closed ring shape, and is disposed at a predetermined distance from an outer circumference of the electromagnetic band gap structure 11. The auxiliary pattern 12 is provided to surround the outer circumference of the electromagnetic band gap structure 11.

The electromagnetic band gap structure 11 includes a via pattern 111, a stub pattern 112 for low frequency (first electromagnetic band gap structure), and a stub pattern 113 for high frequency (second electromagnetic band gap structure). Each of the stub pattern 112 and the stub pattern 113 configures an open stub.

Figure 3:
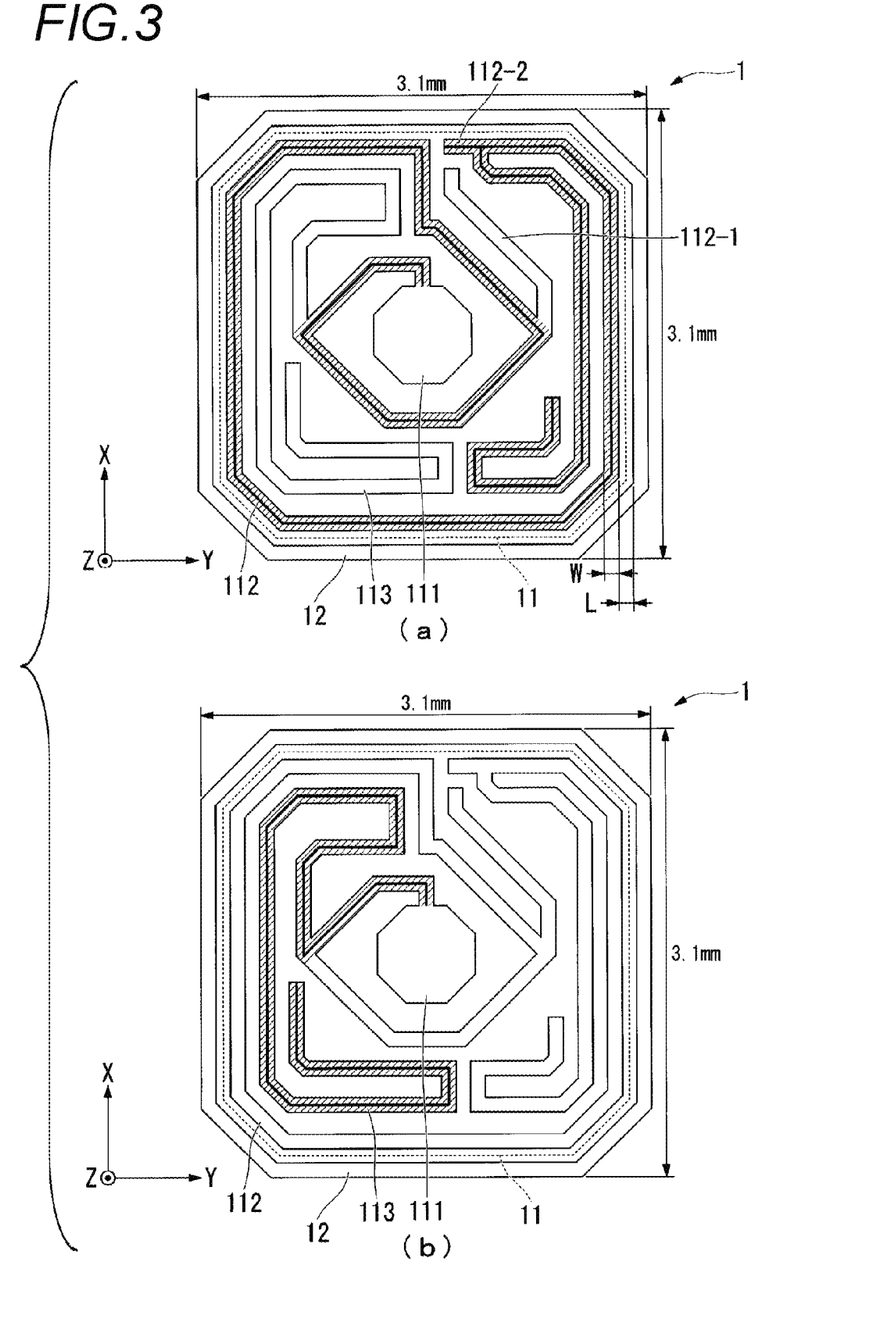
FIG. 3 is a view illustrating a structure of a stub pattern 112 for a first frequency and a stub pattern 113 for a second frequency higher than the first frequency, in an electromagnetic band gap structure 11.

FIG. 3 is a view illustrating a structure of the stub pattern 112 for a first frequency and the stub pattern 113 for a second frequency higher than the first frequency, in the electromagnetic band gap structure 11. Here, the first frequency is, for example, a frequency (first frequency) of 2.45 GHz for a wireless LAN. Meanwhile, the second frequency is higher than the first frequency, and is a frequency (second frequency) of 5.44 GHz for the wireless LAN.

FIG. 3(a) illustrates the stub pattern 112 for low frequency that functions as a stub for the first frequency, which is denoted by a hatch pattern. The stub pattern 112 for low frequency is configured by a pattern disposed in a bent shape, for example, any one of patterns of a folding structure, such as a spiral shape and a meandering shape, or a combined pattern of the spiral shape and the meandering shape, in the present embodiment. In addition, the stub pattern 112 is configured by an open stub in which a width of a transmission line path is 0.1 mm and the entire length of the transmission line path is 19 mm. In addition, an adjusting stub pattern 112_1 is a transmission line path, and a width thereof is 0.1 mm and a length thereof is 1.37 mm. An adjusting stub pattern 112_2 has a width of 0.1 mm and a length of 1.37 mm. Each of the adjusting stub patterns 112_1 and 112_2 described above extends by using a part of the transmission line path of the stub pattern 112 as a starting point so as to finely adjust a stub length of the stub pattern 112, and may be added or remove, if necessary. In addition, the lengths of the adjusting stub patterns 112_1 and 112_2 are set such that the stub length of the stub pattern 112 can be adjusted.

In FIG. 3(a), the stub pattern 112 has an electrical length of approximately $\lambda/3.7$ with respect to the frequency of 2.45 GHz (first frequency lower than a frequency of 5.44 GHz which will be described below), and has inductive impedance. Impedance $Z_{in}$ which is viewed from one end portion of the open stub is represented by a following equation.

$$Z_{in} = -jZ_0 \cot \beta l$$

In the equation, $\beta$ is a phase constant, and is represented by $2\pi/\lambda$ if a length of an electromagnetic wave on the stub pattern which is a transmission line path is referred to as $\lambda$. l is a physical length (mm) of the stub pattern. $Z_0$ is characteristic impedance of the open stub (transmission line path). Hence, $\beta l$ which is obtained by multiplying $\beta$ by l becomes an electrical length [rad] of the stub pattern.

Here, characteristics of impedance of the open stub are characteristics of inductive impedance in a case where the electrical length of the transmission line path is between $\lambda/4$ and $\lambda/2$, are capacitive impedance in a case where the electrical length of the transmission line path is shorter than $\lambda/4$, and become zero in a case where the electrical length of the transmission line path is $\lambda/4$.

The electrical length is approximately $\lambda/3.7$ at 2.45 GHz, that is, the electrical length is between $\lambda/4$ and $\lambda/2$, and thus, the stub pattern 112 in the figure has characteristics of inductive impedance, and forms an electromagnetic band gap structure.

The auxiliary pattern 12 has, for example, a ring shape with a predetermined width, and is provided to surround the outer circumference of the stub pattern 112. In addition, the auxiliary pattern 12 has the electrical length of approximately $\lambda/6$ to $\lambda/7$ at a frequency of 2.45 GHz. Accordingly, the auxiliary pattern 12 has the electrical length shorter than $\lambda/4$, and thus, the auxiliary pattern has characteristics of capacitive impedance.

In this way, the auxiliary pattern 12 is provided along the outer circumference of the stub pattern 112, thereby being capacitively coupled to the stub pattern 112. Thereby, the auxiliary pattern performs capacitance loading to the stub pattern 112, increases capacitance components of the stub pattern 112, and thus, the electrical length of the stub pattern 112 can be increased to a length greater than approximately $\lambda/3.7$. As a result, it is possible to obtain effects in which a resonance frequency decreases, in a case where the stub pattern 112 is shorter, or in the same manner as in a case where a prepreg (reinforcing dielectric layer 104) which will be described below is thinned.

In addition, a relationship between a line width W of the stub pattern 112 and a distance L between the stub pattern 112 and the auxiliary pattern 12 is W>L.

FIG. 3(b) illustrates the stub pattern 113 for the second frequency that functions as a stub for the second frequency, which is denoted by a hatch pattern. The stub pattern 113 is configured by a pattern of the spiral shape, a pattern of the folding structure such as the meandering shape, or a pattern of a serpentine shape which is obtained by combining the spiral shape illustrated in FIG. 3(b) and the meandering shape, in the present embodiment. In addition, the stub pattern 113 is configured by, for example, an open stub in which a width of a transmission line path is 0.1 mm and the entire length of the transmission line path is 8.9 mm. In FIG. 3(b), the stub pattern 113 has an electrical length of approximately $\lambda/3.7$ with respect to the frequency of 5.44 GHz (second frequency higher than the frequency of 2.45 GHz described above), in the same manner as the stub pattern 112. The stub pattern 113 has inductive impedance and forms an electromagnetic band gap structure. The stub pattern 113 for the second frequency of FIG. 3(b) locally has no pattern with characteristics of capacitive impedance, and thus, a resonance frequency is set only by a length of the pattern as a transmission path.

Figure 4:
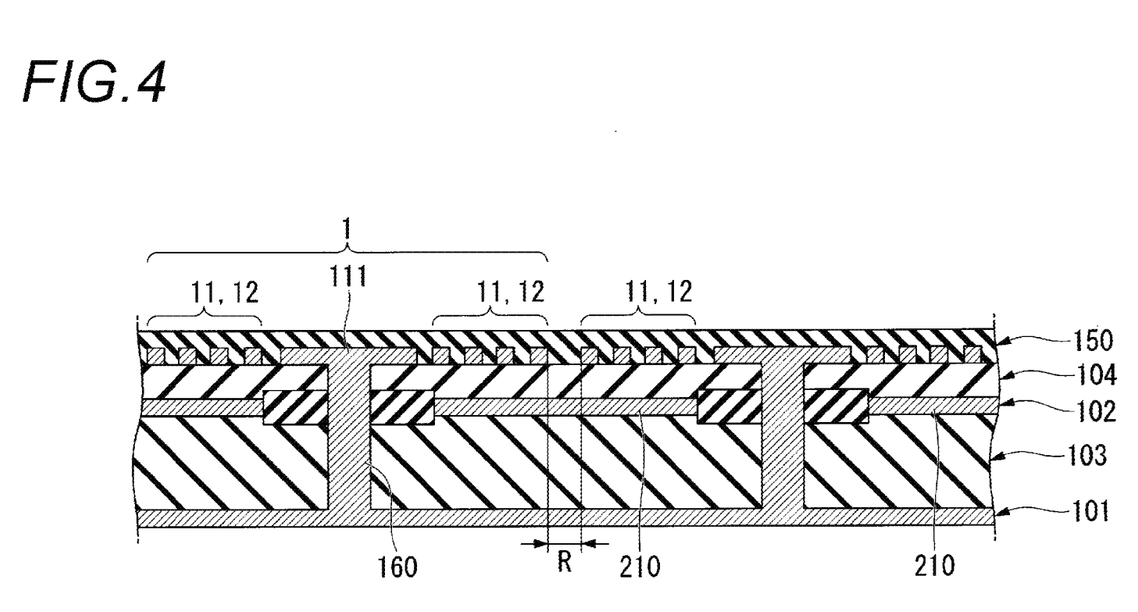
FIG. 4 is a sectional view of the printed circuit substrate in which the electromagnetic band gap structural body 1 of a surface type is disposed.

FIG. 4 is a sectional view of the printed circuit substrate in which the electromagnetic band gap structural body 1 of a surface type is disposed. FIG. 4 illustrates a cross-section when the printed circuit substrate is taken along line IV-IV in FIG. 1. The reference plane 101 which uses, for example, copper as a material and has a thickness of 35 µm is disposed on a lower surface of a core substrate 103, as a conductive layer such as a metal. The core substrate 103 uses glass epoxy with a dielectric constant of 4.3 as a material and has a thickness of 0.4 mm. In addition, the power plane 102 which uses, for example, copper as a material and has a thickness of 35 µm is disposed on an upper surface of the core substrate 103, as a conductive layer such as a metal. Here, in FIG. 4, a surface facing an upper direction of the figure is referred to as an upper surface, and a surface facing a lower direction of the figure is referred to as a lower surface, in the substrate or the like.

The reinforcing dielectric layer 104 (prepreg) which uses glass epoxy with dielectric constant of 4.3 as a material and has a thickness of 0.2 mm is disposed on the upper surface of the power plane 102. In addition, the electromagnetic band gap structural body 1 which is a conductive layer such as a metal, uses, for example, copper as a material, and has a thickness of 35 µm is formed on the upper surface of the reinforcing dielectric layer 104. A layer of a soldering resist 150 with a thickness of, for example, 0.05 mm is formed on the upper surface of the reinforcing dielectric layer 104 which is exposed and the upper surface of the electromagnetic band gap structural body 1. The via pattern 111 is connected to the reference plane 101 through a via hole 160 with a diameter of 0.3 mm.

A pattern 210 in the power plane 102 is formed under the electromagnetic band gap structure 11 and the auxiliary pattern 12 of the electromagnetic band gap structural body 1 through the reinforcing dielectric layer 104. In addition, a distance R between the electromagnetic band gap structural bodies 1 adjacent to each other in a horizontal direction is, for example, 2 mm. In this way, the electromagnetic band gap structural body 1 is provided on the upper surface of the reinforcing dielectric layer 104 as a surface type, in FIG. 4. Since the electromagnetic band gap structural body 1 is observed through the soldering resist 150, the electromagnetic band gap structural body 1 formed on the upper surface of the reinforcing dielectric layer 104 is configured as a surface type.

By the aforementioned configuration of the printed circuit substrate, electromagnetic noise corresponding to the resonance frequency of the electromagnetic band gap structure 11 among electromagnetic noise being generated from electronic components is prevented from propagating through the printed circuit substrate 101, when the electronic components are disposed on an upper portion of the soldering resist 150.

In the present embodiment, frequencies of the stub pattern 112 and the stub pattern 113 in the electromagnetic band gap structural body 1 are respectively 2.45 GHz and 5.44 GHz, and thus, the electromagnetic noise of the frequencies is prevented from propagating through the printed circuit substrate. As a result, according to the present embodiment, effects of the electromagnetic noise on an analog circuit of the wireless LAN which is disposed on the same substrate are reduced, and thus, it is possible to prevent the electromagnetic noise from interfering communication data on the wireless LAN.

Figure 5:
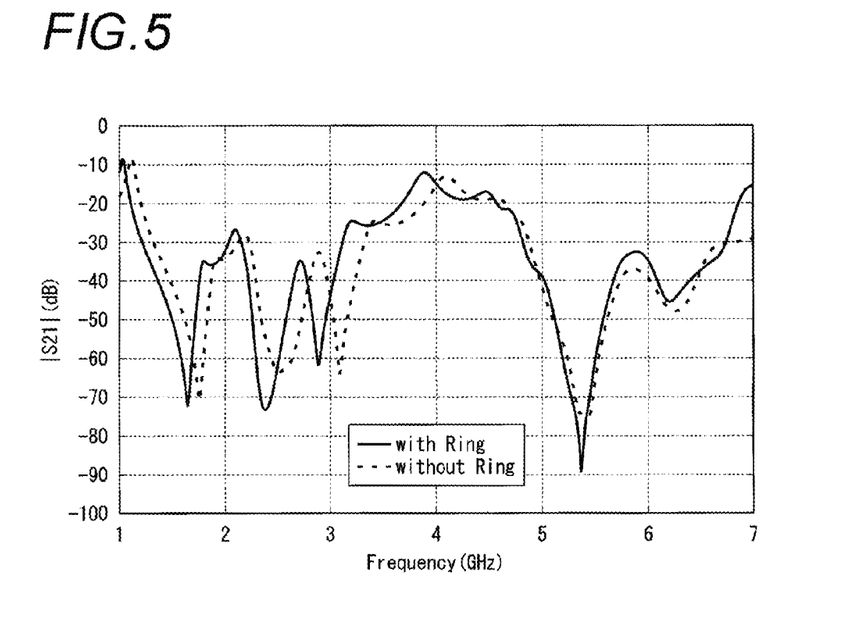
FIG. 5 is a graph illustrating correspondence between a frequency and an S parameter (insertion loss $S_{21}$) of the electromagnetic band gap structural body 1 (surface type).

FIG. 5 is a graph illustrating correspondence between a frequency and an S parameter (insertion loss $S_{21}$) of the electromagnetic band gap structural body 1 (surface type). In FIG. 5, a horizontal axis denotes a frequency and a vertical axis denotes the insertion loss $S_{21}$. In addition, in FIG. 5, a dashed line denotes correspondence between the frequency and the insertion loss $S_{21}$ of the electromagnetic band gap structural body 1 (that is, the electromagnetic band gap structure 11), in a case where the auxiliary pattern 12 is not provided in the outer circumference of the electromagnetic band gap structure 11. Meanwhile, a solid line denotes correspondence between the frequency and the insertion loss $S_{21}$ of the electromagnetic band gap structural body 1, in a case where the auxiliary pattern 12 is provided in the outer circumference of the electromagnetic band gap structure 11.

If the dashed line is compared to the solid line, it can be seen that a frequency in which the electromagnetic noise is attenuated (the insertion loss $S_{21}$ increases) moves to a lower frequency side, in a frequency side lower than 4 GHz, in a case of the solid line. In addition, it can be seen from FIG. 5 that the electromagnetic noise is significantly attenuated in 2.4 GHz to 2.5 GHz and 5 GHz to 5.7 GHz which are frequency bandwidths being used by the wireless LAN, in the printed circuit substrate according to the present embodiment.

Here, attenuation at a frequency equal to or lower than 2 GHz is generated depending on a size of the power plane 102, and is different from attenuation which is generated by the electromagnetic band gap structural body 1.

Figure 6:
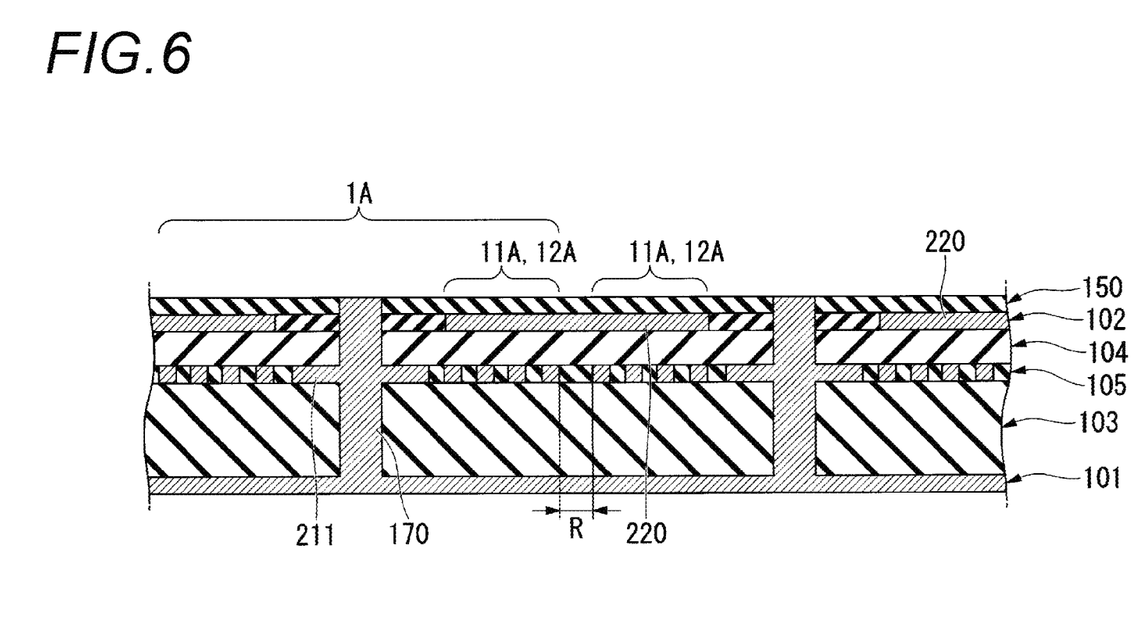
FIG. 6 is a sectional view of the printed circuit substrate in which an electromagnetic band gap structural body 1A of an embedded type is disposed.

FIG. 6 is a sectional view of the printed circuit substrate in which an electromagnetic band gap structural body 1A of an embedded type is disposed. Here, in FIG. 6, a surface facing an upper direction of the figure is referred to as an upper surface, and a surface facing a lower direction of the figure is referred to as a lower surface, in the substrate or the like. The reference plane 101 which uses, for example, copper as a material and has a thickness of 35 µm is disposed on a lower surface of a core substrate 103, as a conductive layer such as a metal. In addition, an electromagnetic band gap layer 105 which is configured with the plural electromagnetic band gap structural bodies 1, each using, for example, copper as a material and is formed by a pattern with a thickness of 35 µm, is disposed on an upper surface of the core substrate 103, as a conductive layer such as a metal. The reinforcing dielectric layer 104 is formed on the upper surface of the electromagnetic band gap layer 105. The power plane 102 is formed on the upper surface of the reinforcing dielectric layer 104. The soldering resist 150 is formed on the upper surface of the power plane 102 and the upper surface of the reinforcing dielectric layer 104 which is exposed.

The via pattern 211 is connected to the reference plane 101 through a via hole 170 having a diameter of, for example, 0.3 mm. A pattern 220 in the power plane 102 is formed on an upper portion of an electromagnetic band gap structure 11A and an auxiliary pattern 12A in the electromagnetic band gap structural body 1A through the reinforcing dielectric layer 104. In addition, a distance R between the electromagnetic band gap structural bodies 1A adjacent to each other in a horizontal direction is 0.2 mm in the same manner as in the embodiment described above. In this way, in FIG. 6, the electromagnetic band gap structural body 1A is provided to be embedded between the reinforcing dielectric layer 104 and the core substrate 103.

Figure 7:
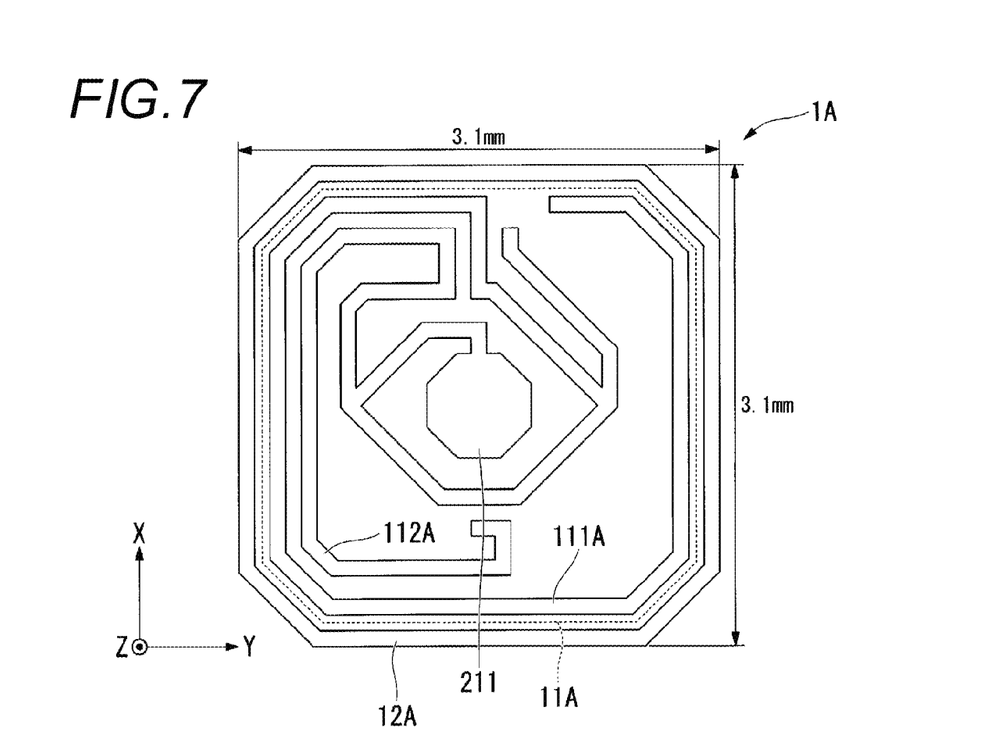
FIG. 7 is a plan view illustrating a configuration example of the electromagnetic band gap structural body 1A which is used for an internal layer type of FIG. 6.

FIG. 7 is a plan view illustrating a configuration example of the electromagnetic band gap structural body 1A which is used for an internal layer type of FIG. 6. In FIG. 7, the electromagnetic band gap structural body 1A is an electromagnetic band gap structural body of a surface type which is formed on the upper surface of the core substrate 103. In addition, for example, an outer shape of the electromagnetic band gap structural body 1A has a length of 3.1 mm in the X-axis direction and a length of 3.1 mm in the Y-axis direction.

In addition, the electromagnetic band gap structural body 1A is configured with the electromagnetic band gap structure 11A and the auxiliary pattern 12A. The auxiliary pattern 12A has, for example, a closed ring shape, and is disposed at a predetermined distance from an outer circumference of the electromagnetic band gap structure 11A. The auxiliary pattern 12A is provided to surround the outer circumference of the electromagnetic band gap structure 11A.

The electromagnetic band gap structure 11A includes a via pattern 211, a stub pattern 112A for the first frequency, and a stub pattern 113A for the second frequency. Each of the stub pattern 112A and the stub pattern 113A configures an open stub. The electromagnetic band gap structural body 1A of an embedded type adjusts a stub length of each of the stub patterns 112A and 113A depending on the difference between the electrical lengths, and a basic structure thereof is the same as the electromagnetic band gap structural body 1 of a surface type. In addition, the electromagnetic band gap structure 11A is formed on one main surface (front surface) of the core substrate 103. The reinforcing dielectric layer 104 is formed on an upper portion of a surface on which the electromagnetic band gap structures 11A are arranged. That is, the electromagnetic band gap structure 11A is formed to be interposed between the core substrate 103 and the reinforcing dielectric layer 104. Accordingly, the electromagnetic band gap structure 11A is defined as an embedded type in the present embodiment.

Figure 8:
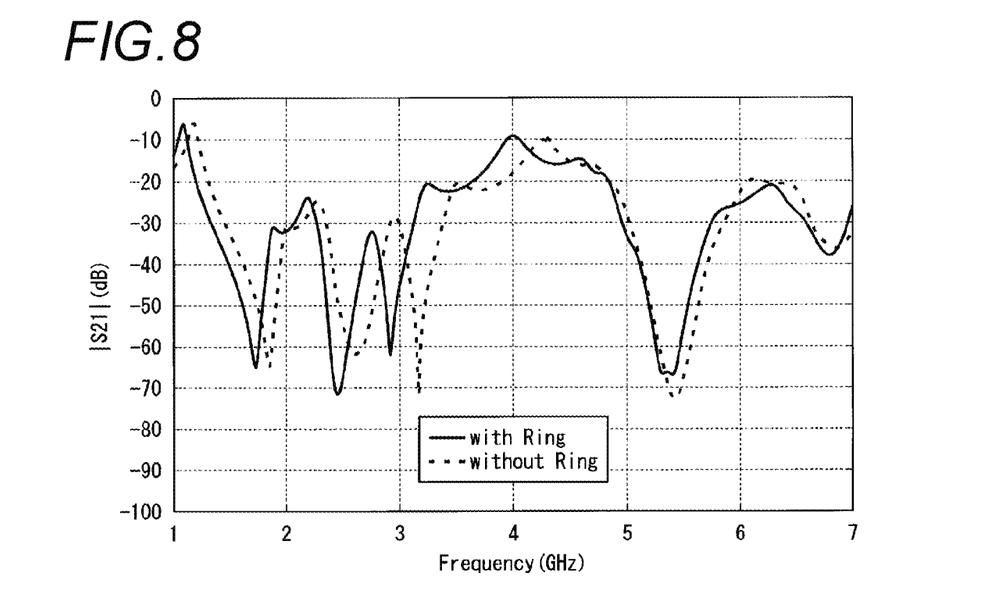
FIG. 8 is a graph illustrating correspondence between a frequency and an S parameter (insertion loss $S_{21}$) of the electromagnetic band gap structural body 1A (embedded type).

FIG. 8 is a graph illustrating correspondence between a frequency and an S parameter (insertion loss $S_{21}$) of the electromagnetic band gap structural body 1A (embedded type). In FIG. 8, a horizontal axis denotes a frequency and a vertical axis denotes the insertion loss $S_{21}$. In addition, in FIG. 8, a dashed line denotes correspondence between the frequency and the insertion loss $S_{21}$ of the electromagnetic band gap structural body 1A (that is, the electromagnetic band gap structure 11A), in a case where the auxiliary pattern 12A is not provided in an outer circumference of the electromagnetic band gap structure 11A. Meanwhile, a solid line denotes correspondence between the frequency and the insertion loss $S_{21}$ of the electromagnetic band gap structural body 1A, in a case where the auxiliary pattern 12A is provided in the outer circumference of the electromagnetic band gap structure 11A.

If the dashed line is compared to the solid line, it can be seen that a frequency in which the electromagnetic noise is attenuated (the insertion loss $S_{21}$ increases) moves to a lower frequency side, in a frequency side lower than 4 GHz, in a case of the solid line. In addition, it can be seen from FIG. 8 that the electromagnetic noise is significantly attenuated in 2.4 GHz to 2.5 GHz and 5 GHz to 5.7 GHz which are frequency bandwidths being used by the wireless LAN, in the printed circuit substrate according to the present embodiment.

Here, attenuation at a frequency equal to or lower than 2 GHz is generated depending on a size of the power plane 102, and is different from attenuation which is generated by the electromagnetic band gap structural body 1A.

As described above, according to the present embodiment, the auxiliary pattern 12 (12A) performs capacitance loading to the stub pattern 112 (112A) in the electromagnetic band gap structure 11 (11A), and decreases a resonance frequency of the electromagnetic band gap structure 11, and thus, the electromagnetic band gap structural body 1 can be minimized, compared to a case where the resonance frequency is decreased by increasing the length of the outer circumference of the electromagnetic band gap structure 11 (11A) in the same manner as in the related approximation ray theory. For example, in a case of the same configuration as in the present embodiment, if the auxiliary pattern 12 is not formed along the outer circumference of the electromagnetic band gap structure 11, a size of the electromagnetic band gap structural body becomes a size of 3.5 mm×3.5 mm. Since the electromagnetic band gap structural body 1 according to the present embodiment has a size of 3.1 mm×3.1 mm, the size thereof is increased by 78%, compared to the size of 3.5 mm×3.5 mm in a case where the auxiliary pattern 12 is not provided, and it is possible to minimize the size of the electromagnetic band gap structural body.

In addition, according to the present embodiment, it is also possible to reduce strength of emitted electromagnetic field by using the electromagnetic band gap structural body 1 (1A).

For example, in a case where the printed circuit substrate has no the electromagnetic band gap structural body 1, the strength of the emitted electromagnetic field is 1.13 (μW) at 2.45 GHz on the low frequency side, and the strength of the emitted electromagnetic field is 57.2 (μW) at 5.44 GHz on the high frequency side.

Meanwhile, in a case where the printed circuit substrate uses the electromagnetic band gap structural body 1 of a surface type, the strength of the emitted electromagnetic field is 0.0609 (μW) at 2.45 GHz on the low frequency side, and the strength of the emitted electromagnetic field is 0.252 (μW) at 5.44 GHz on the high frequency side.

In a case where the printed circuit substrate uses the electromagnetic band gap structural body 1A of an internal layer type, the strength of the emitted electromagnetic field is 0.00475 (μW) at 2.45 GHz on the low frequency side, and the strength of the emitted electromagnetic field is 0.201 (μW) at 5.44 GHz on the high frequency side.

As described above, according to the present embodiment, the stub pattern 112 (112A) in the electromagnetic band gap 11 (11A) is formed to be surrounded by the auxiliary pattern 12 (12A), and thereby the length of the stub pattern 112 (112A) is increased. Accordingly, the electromagnetic band gap structure 11 (11A) can be minimized, compared to the configuration in which the resonance frequency decreases, and it is possible to effectively use a mounting space.

In the present embodiment, the auxiliary pattern 12 (12A) may have an open ring pattern instead of the closed ring pattern, as long as the resonance frequency of the electromagnetic band gap structural body 1 decreases to a target frequency and the auxiliary pattern has a length with capacitive impedance characteristics. In addition, if the auxiliary pattern 12 has the length with the capacitive impedance characteristics, the auxiliary pattern 12 may be configured by a straight line pattern that is disposed at a location in which the straight line pattern has capacitive coupling with a side of the outer circumference of the electromagnetic band gap structure 11 (11A).

The auxiliary pattern 12 (12A) may have a configuration in which an open via is provided and thereby capacitance increases.

In addition, the auxiliary pattern 12 (12A) may have a configuration in which the pattern of the auxiliary pattern is divided into a plurality of elements and the elements are connected to each other by a gap capacitor, a capacitor, a resistor, or the like.

Furthermore, an insulating layer is provided on an upper portion of the electromagnetic band gap structure 11 (11A), an auxiliary pattern of the stub pattern 112 (112A) is formed on an upper portion of the insulating layer in a planar view, and thereby a frequency can be shifted to a low frequency side. Accordingly, according to the present embodiment, the size of the electromagnetic band gap structural body 11 (11A) can be further minimized, and thus it is possible to effectively use the mounting space.

Figure 9:
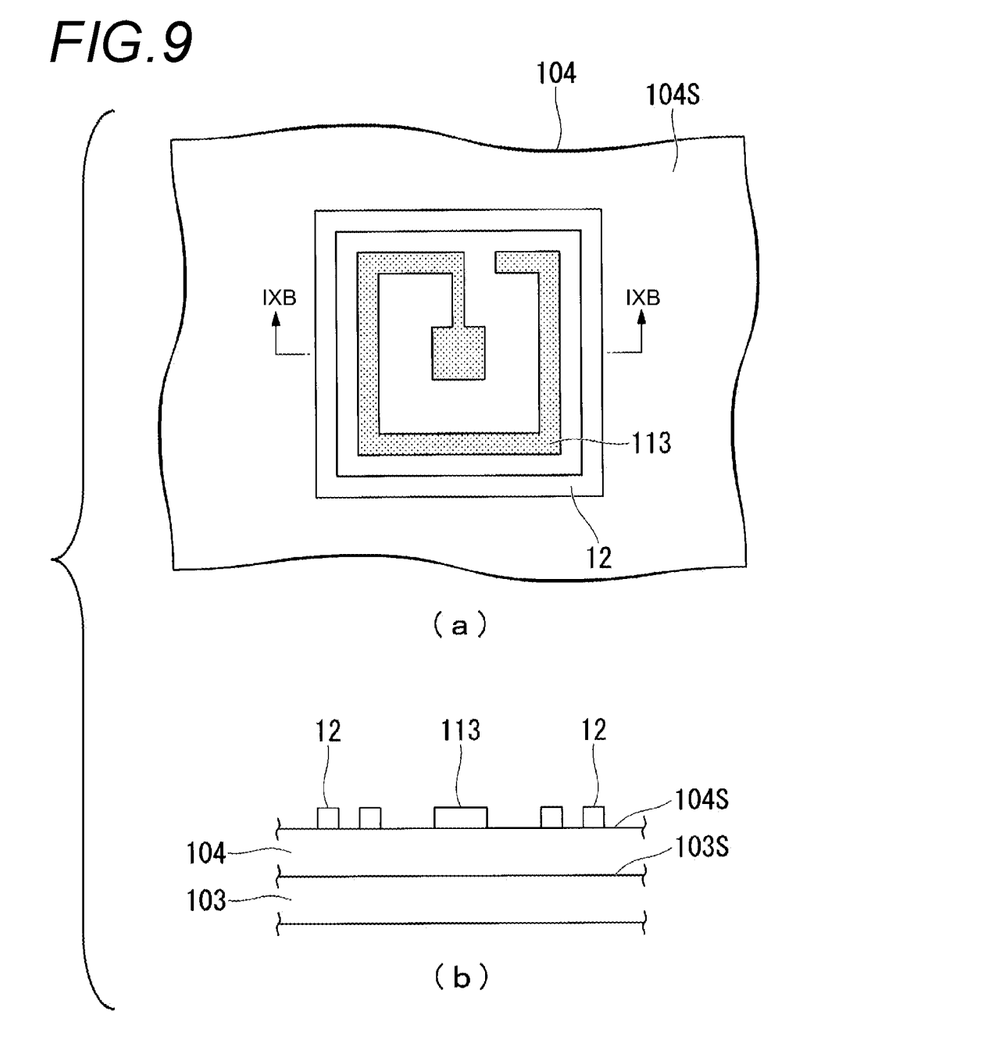
FIG. 9 is a diagram illustrating concept of the printed circuit substrate according to the present invention.

FIG. 9 is a diagram illustrating concept of the printed circuit substrate according to the present invention. FIG. 9(a) illustrates a printed circuit substrate in which patterns of each of the stub pattern 113 (first electromagnetic band gap structure) and the auxiliary pattern 12 (auxiliary pattern) are disposed on a surface 104S (one surface of the reinforcing dielectric layer) of the reinforcing dielectric layer 104 (reinforcing dielectric layer) in a planar view in FIG. 9. In addition, FIG. 9(b) is a cross-sectional view taken along line IXB-IXB of the printed circuit substrate of FIG. 9(a).

As illustrated in FIG. 9(a), the patterns of each of the stub pattern 113 (first electromagnetic band gap structure) and the auxiliary pattern 12 (auxiliary pattern) are formed on the surface 104S (one surface of the reinforcing dielectric layer) of the reinforcing dielectric layer 104 (reinforcing dielectric layer). The auxiliary pattern 12 (auxiliary pattern) is formed at a predetermined distance from the outer circumference of the stub pattern 113 (first electromagnetic band gap structure). The auxiliary pattern 12 (auxiliary pattern) decreases the resonance frequency of the stub pattern 113 (first electromagnetic band gap structure), and thus the auxiliary pattern is provided to perform capacitance loading to the stub pattern 113 (first electromagnetic band gap structure).

In FIG. 9(b), the reinforcing dielectric layer 104 (reinforcing dielectric layer) is provided on a surface 103S (one surface of the core substrate) of the core substrate 103 (core substrate). Patterns of each of the stub pattern 113 (first electromagnetic band gap structure) and the auxiliary pattern 12 (auxiliary pattern) are formed on the surface 104S (one surface of the reinforcing dielectric layer) of the reinforcing dielectric layer 104 (reinforcing dielectric layer). By the configuration, electromagnetic noise corresponding to the resonance frequency of the stub pattern 113 (first electromagnetic band gap structure) among electromagnetic noise being generated from electronic components is prevented from propagating through printed circuit substrate, when electronic components are disposed on the printed circuit substrate. In addition, the auxiliary pattern 12 (auxiliary pattern) performs capacitance loading to the stub pattern 113 (first electromagnetic band gap structure), and decreases the resonance frequency of the stub pattern 113 (first electromagnetic band gap structure).

According to the present invention, by employing the configuration of the stub pattern 113 (first electromagnetic band gap structure) and the auxiliary pattern 12 (auxiliary pattern) which are illustrated in FIG. 9 described above, the stub pattern 113 (first electromagnetic band gap structure) can be minimized and the mounting space in the printed circuit substrate can be effectively used, compared to a case where the resonance frequency is decreased by increasing the length of the outer circumference of the stub pattern 113 (first electromagnetic band gap structure) in the same manner as in the related art.

The present embodiment is described by using the printed circuit substrate as an example, but can also be applied to a circuit substrate without a printed pattern.

The present application is based upon the Japanese Patent Application No. 2014-121596; filed on Jun. 12, 2014; the contents of which are incorporated herein by reference.

REFERENCE SIGNS LIST

- 1,1A: ELECTROMAGNETIC BAND GAP STRUCTURAL BODY
- 11,11A: ELECTROMAGNETIC BAND GAP STRUCTURE
- 12,12A: AUXILIARY PATTERN
- 101: REFERENCE PLANE
- 102: POWER PLANE
- 103: CORE SUBSTRATE
- 104: REINFORCING DIELECTRIC LAYER
- 111: VIA PATTERN
- 112,113,112A: STUB PATTERN
- 112_1,112_2: ADJUSTING STUB PATTERN
- 150: SOLDERING RESIST
- 160,170: VIA HOLE
- 211: VIA PATTERN
- 210,220: PATTERN

The invention claimed is:

1. A circuit substrate comprising:
   a core substrate;
   a reinforcing dielectric layer that is provided on one surface of the core substrate;
   a first electromagnetic band gap structure that is provided on one surface side of the reinforcing dielectric layer and configured to reduce electromagnetic noise in a predetermined first frequency propagating through the core substrate; and
   an auxiliary pattern that is formed at a predetermined distance from an outer circumference of a conductive pattern which forms the first electromagnetic band gap structure.

2. The circuit substrate according to claim 1, wherein the auxiliary pattern has a length with capacitive impedance in a wavelength of the first frequency.

3. The circuit substrate according to claim 2, wherein the auxiliary pattern is capacitively coupled with the first electromagnetic band gap structure.

4. The circuit substrate according to claim 1, wherein the first electromagnetic band gap structure is configured with an open stub that is a pattern which is wired in a bent shape,
   the circuit substrate further comprising:
   a second electromagnetic band gap structure that is provided to be surrounded by the open stub and configured to reduce electromagnetic noise in a second frequency higher than the first frequency.

5. The circuit substrate according to claim 1, wherein each of the first electromagnetic band gap structure and the auxiliary pattern is provided on a surface of the reinforcing dielectric layer, which faces the core substrate.

6. The circuit substrate according to claim 1, wherein each of the first electromagnetic band gap structure and the auxiliary pattern is provided on a surface of the reinforcing dielectric layer, which does not face the core substrate.

7. The circuit substrate according to claim 1, wherein the auxiliary pattern is formed by a closed ring structure or an open ring structure which is provided in a periphery of an outermost circumference of the first electromagnetic band gap structure.

8. A noise reduction method for a circuit substrate including a core substrate and a reinforcing dielectric layer which is provided on one surface of the core substrate, the noise reduction method comprising:
   providing a first electromagnetic band gap structure on one surface side of the reinforcing dielectric layer so as to reduce electromagnetic noise in a predetermined first frequency propagating through the core substrate;
   providing an auxiliary pattern at a predetermined distance from an outer circumference of a conductive pattern in which the first electromagnetic band gap structure is formed; and
   causing the first electromagnetic band gap structure to reduce electromagnetic noise propagating through the circuit substrate.

9. The noise reduction method according to claim 8, wherein the auxiliary pattern has a length with capacitive impedance in a wavelength of the first frequency.

10. The noise reduction method according to claim 9, wherein the auxiliary pattern is capacitively coupled with the first electromagnetic band gap structure.

11. The noise reduction method according to claim 10, wherein the first electromagnetic band gap structure is configured with an open stub that is a pattern which is wired in a bent shape,
    the noise reduction method further comprising:
    providing a second electromagnetic band gap structure that is provided to be surrounded by the open stub to reduce electromagnetic noise in a second frequency higher than the first frequency.

12. The noise reduction method according to claim 8, wherein each of the first electromagnetic band gap structure and the auxiliary pattern is provided on a surface of the reinforcing dielectric layer, which faces the core substrate.

13. The noise reduction method according to claim 8, wherein each of the first electromagnetic band gap structure and the auxiliary pattern is provided on a surface of the reinforcing dielectric layer, which does not face the core substrate.

14. The noise reduction method according to claim 8, wherein the auxiliary pattern is formed by a closed ring structure or an open ring structure which is provided in a periphery of an outermost circumference of the first electromagnetic band gap structure.

* * * * *